United States Patent
Uchida

(10) Patent No.: US 12,538,439 B2
(45) Date of Patent: Jan. 27, 2026

(54) VEHICLE CONTROL DEVICE

(71) Applicant: Hitachi Astemo, Ltd., Hitachinaka (JP)

(72) Inventor: Takatoshi Uchida, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 156 days.

(21) Appl. No.: 18/560,559

(22) PCT Filed: Feb. 7, 2022

(86) PCT No.: PCT/JP2022/004670
§ 371 (c)(1),
(2) Date: Nov. 13, 2023

(87) PCT Pub. No.: WO2022/249558
PCT Pub. Date: Dec. 1, 2022

(65) Prior Publication Data
US 2024/0260204 A1    Aug. 1, 2024

(30) Foreign Application Priority Data
May 24, 2021  (JP) .................. 2021-086771

(51) Int. Cl.
*H05K 5/00* (2025.01)
(52) U.S. Cl.
CPC .................. *H05K 5/0052* (2013.01)
(58) Field of Classification Search
None
See application file for complete search history.

(56) References Cited

U.S. PATENT DOCUMENTS

| 11,317,530 B2* | 4/2022 | Aida .................... H05K 5/0065 |
| 2004/0017667 A1* | 1/2004 | Nasu .................... H05K 5/0073 361/752 |

(Continued)

FOREIGN PATENT DOCUMENTS

| JP | 60-30542 U | 3/1985 |
| JP | 2004-63623 A | 2/2004 |

(Continued)

OTHER PUBLICATIONS

International Search Report (PCT/ISA/210) issued in PCT Application No. PCT/JP2022/004670 dated Apr. 26, 2022 with English translation (4 pages).

(Continued)

*Primary Examiner* — Allen L Parker
*Assistant Examiner* — Christopher L Augustin
(74) *Attorney, Agent, or Firm* — Crowell & Moring LLP

(57) ABSTRACT

An object of the present invention is to provide a vehicle control device including a snap-fit portion capable of improving waterproof performance and reducing a protruding amount of protruding to the inside or outside of a housing with a simple shape. A vehicle control device according to the present invention includes: a substrate 1 which includes an electronic circuit for controlling a vehicle; a case 3 which has an opening portion at one end and fixed in a state where the substrate 1 is inserted; and a cover 4 which is assembled to the case 3 so as to cover the opening portion. A fitting recess 33 is provided in the case 3, and a first snap-fit portion 41 having a first fitting protrusion 42 fitted in the fitting recess 33 is provided in the cover 4. The fitting recess 33 does not penetrate a member of the case 3 and is provided in a state where a side opposite to a side to which the first fitting protrusion 42 is fitted is closed. The (Continued)

first fitting protrusion 42 is inserted into the case 3 to be fitted into the fitting recess 33.

11 Claims, 6 Drawing Sheets

(56) References Cited

U.S. PATENT DOCUMENTS

| | | | | |
|---|---|---|---|---|
| 2019/0334276 A1* | 10/2019 | Ichikawa | ............. | H01R 12/724 |
| 2019/0380215 A1* | 12/2019 | Tsujiya | ................ | H05K 5/0039 |
| 2021/0176883 A1* | 6/2021 | Uchida | ................ | H05K 5/0039 |

FOREIGN PATENT DOCUMENTS

| | | | |
|---|---|---|---|
| JP | 2009-253051 A | | 10/2009 |
| JP | 2018131118 A | * | 8/2018 |
| JP | 2020-53597 A | | 4/2020 |

OTHER PUBLICATIONS

Japanese-language Written Opinion (PCT/ISA/237) issued in PCT Application No. PCT/JP2022/004670 dated Apr. 26, 2022 with English translation (7 pages).

* cited by examiner

VEHICLE CONTROL DEVICE

TECHNICAL FIELD

The present invention relates to a vehicle control device.

BACKGROUND ART

JP 2018-131118 A (PTL 1) discloses a vehicle control device including a snap-fit portion for fixing fitting between a case and a cover. One of the problems of the vehicle control device of PTL 1 is that the vehicle control device is compatible with a simple waterproof structure. The snap-fit portion to be fitted to the case or the cover from an inner peripheral side of a counterpart side and a fitting protrusion on an outer peripheral side are installed, and a fitting hole installed on the counterpart side is installed so as not to be visually recognized in appearance. With such a configuration, a simple waterproof structure is realized without increasing the number of components (see Abstract and FIGS. 1 to 3).

CITATION LIST

Patent Literature

PTL 1: JP 2018-131118 A

SUMMARY OF INVENTION

Technical Problem

In the vehicle control device of PTL 1, the case or the cover is provided with the snap-fit portion and the fitting protrusion facing the snap-fit portion, and thus, the shape of the case or the cover becomes complicated, and it is necessary to take effort and time to manufacture the case or the cover having the snap-fit portion and the fitting protrusion. In addition, in a case where the snap-fit portion and the fitting protrusion are provided on a cover side (FIGS. 1 and 3 of PTL 1), the fitting protrusion protrudes outward from the outer peripheral surface of the case, so that the outer contour of a housing constituted by the case and the cover becomes large. Alternatively, in a case where the snap-fit portion and the fitting protrusion are provided on a case side (FIG. 2 of PTL 1), a gap for sandwiching the cover-side member (portion) exists between the snap-fit portion and the fitting protrusion, so that the snap-fit portion largely protrudes to the inside of the housing, and the internal volume of the housing is reduced.

An object of the present invention is to provide a vehicle control device including a snap-fit portion capable of improving waterproof performance and reducing a protruding amount of protruding to the inside or outside of a housing with a simple shape.

Solution to Problem

In order to achieve the above object, a vehicle control device according to the present invention includes: a substrate which includes an electronic circuit for controlling a vehicle; a case which has an opening portion at one end and fixed in a state where the substrate is inserted; and a cover which is assembled to the case so as to cover the opening portion, wherein a fitting recess is provided in the case, and a first snap-fit portion having a first fitting protrusion fitted in the fitting recess is provided in the cover, the fitting recess does not penetrate a member of the case and is provided in a state where a side opposite to a side to which the first fitting protrusion is fitted is closed, and the first fitting protrusion is inserted into the case to be fitted into the fitting recess.

Advantageous Effects of Invention

According to the present invention, it is possible to provide the vehicle control device including the snap-fit portion capable of improving waterproof performance and reducing a protruding amount protruding to the inside or the outside of a housing with a simple shape.

Problems, configurations, and effects other than those described above will be clarified by the following description of embodiments.

DESCRIPTION OF EMBODIMENTS

Figure 1:
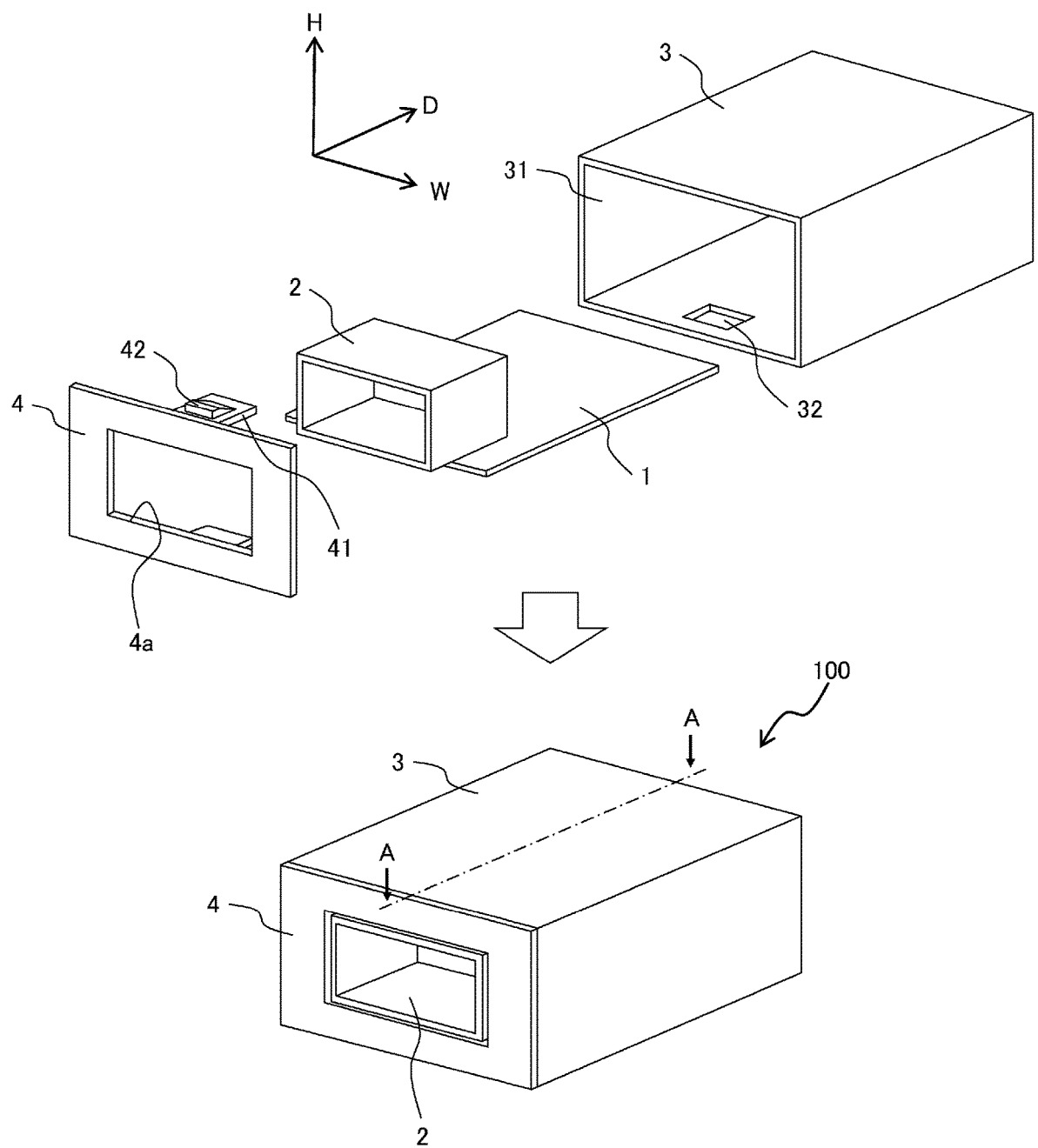
FIG. 1 is an exploded view and an assembly view of a vehicle control device according to an embodiment (first embodiment) of the present invention.

Hereinafter, embodiments of the present invention will be described with reference to the drawings. Note that all or some of the embodiments can be used in combination with each other as long as there is no contradiction. In addition, the same reference numerals are used for the same configurations in each embodiment, and the description thereof will be omitted. In a case where there are different portions in the configurations using the same reference numerals, the different portions will be described.

In the following description, there is a case where a vertical direction is designated and described, but the vertical direction is a direction defined on the basis of the drawing to be described, and does not designate the vertical direction in the mounted state of a vehicle control device 100.

First Embodiment

Figure 2:
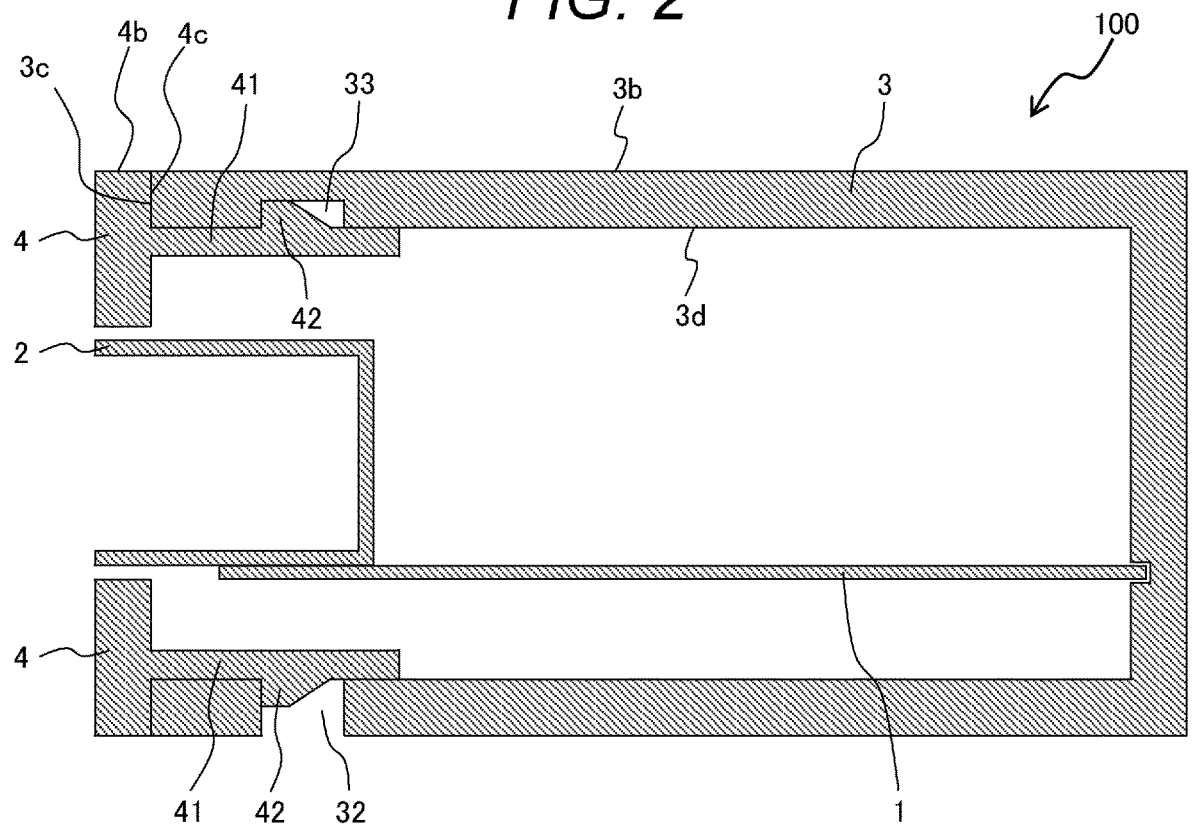
FIG. 2 is a cross-sectional view taken along line A-A in FIG. 1.

A first embodiment of the present invention will be described with reference to FIGS. 1 and 2. FIG. 1 is an exploded view and an assembled view of a vehicle control device according to an embodiment (first embodiment) of the present invention. FIG. 2 is a cross-sectional view taken along line A-A in FIG. 1. Note that FIG. 2 is a cross-sectional view taken in an A-A direction in FIG. 1.

A substrate 1 having a circuit for electrically controlling an external device (not illustrated) is mounted with a connector 2 for electrical connection with the outside. In addition, the connector 2 and the substrate 1 are configured to be slid from an opening portion 31 into the case 3 formed in a bag shape to be incorporated.

The case 3 has an internal space having a rectangular cross section, and has the opening portion 31 at one end in a depth direction. The internal space of the case 3 constitutes a housing space for the substrate 1 and the connector 2. The other end of the case 3 in the depth direction is closed. When the opening portion 31 is closed by the cover 4, the internal space of the case 3 is closed in a watertight state. The case 3 constitutes a housing of the vehicle control device 100 together with the cover 4. Note that the cover 4 has an opening 4a for exposing the connector 2 to the outside, and the connector 2 serves as a role in a watertight structure of the housing (the case 3 and the cover 4). Therefore, the connector 2 can also be regarded as a member constituting a part of the housing.

Hereinafter, a height direction (vertical direction) H, a width direction W, and a depth direction D of the vehicle control device 100 are defined and used as illustrated in FIG. 1. The width direction W is a direction along an upper edge portion and a lower edge portion forming the opening portion 31 of the case 3. The height direction (vertical direction) H is a direction along a side edge portion connecting the upper edge portion and the lower edge portion of the opening portion 31 of the case 3. The depth direction D is a direction perpendicular to the width direction W and the height direction (vertical direction) H, and a side of the opening portion 31 is a front side, and a side opposite to the opening portion 31 is a back side. The height direction (vertical direction) H in this case also does not designate the vertical direction in the mounted state of the vehicle control device 100.

After the substrate 1 is assembled to the case 3, the cover 4 is assembled and fixed to the case 3 so as to cover the substrate 1. The cover 4 is assembled so as to cover the opening portion 31. The cover 4 is provided with a snap-fit portion 41 for being fitted and fixed to the case 3.

The snap-fit portion 41 is inserted into the case 3. Then, a fitting protrusion 42 formed in the snap-fit portion 41 in the upper part of FIG. 2 is fitted into a fitting recess 33 that receives the fitting protrusion 42 of the snap-fit portion 41 provided in the case 3. The fitting recess 33 is formed as a recess recessed outward from an inner peripheral surface (the side surface on the inside: inner side surface) 3d of the case 3. That is, the fitting recess 33 does not penetrate the member of the case 3 provided with the fitting recess 33 and is provided in a state in which the side opposite to the side on which a first fitting protrusion 42 is fitted is closed by an outer peripheral surface 3b of the case 3.

On the other hand, the fitting protrusion 42 formed in the snap-fit portion 41 in the lower part of FIG. 2 is fitted into a fitting hole 32 provided in the case 3. The fitting hole 32 is provided so as to penetrate the member of the case 3 provided with the fitting hole 32.

In order to distinguish the two snap-fit portions 41, sin the following description, the snap-fit portion 41 on the side to be fitted with the fitting recess 33 may be referred to as a first snap-fit portion 41, and the snap-fit portion 41 on the side to be fitted with the fitting hole 32 may be referred to as a second snap-fit portion 41. In addition, the fitting protrusion 42 formed on the first snap-fit portion 41 may be referred to as a first fitting protrusion, and the fitting protrusion 42 formed on the second snap-fit portion 41 may be referred to as a second fitting protrusion.

In the present embodiment, the first snap-fit portion 41 is provided on the cover 4 side and is fitted into the fitting recess 33 provided on the case 3 side. In addition, the second snap-fit portion 41 is provided on the cover 4 side and is fitted into the fitting hole 32 provided on the case 3 side. However, the present invention is not limited to such a form, and the first snap-fit portion 41 may be configured to be provided on the case 3 side and be fitted into the fitting recess 33 provided on the cover 4 side. In addition, the second snap-fit portion 41 may be configured to be provided on the case 3 side and be fitted in the fitting hole 32 provided on the cover 4 side.

In this case, with respect to the configuration in which the fitting recess 33 is provided in any one of the case 3 or the cover 4 and the first fitting protrusion 42 to be fitted in the fitting recess 33 is provided in the other, the fitting recess 33 does not penetrate the member of the case 3 or the cover 4 provided with the fitting recess 33 and is provided in a state in which the side opposite to the side on which the first fitting protrusion 42 is fitted is closed.

An end surface of the cover 4 on the case 3 side is provided with a butting surface 4c butted with an end surface (butting surface) 3c of the case 3 on the cover 4 side in the depth direction D. The butting surface 4c is provided inside the outer peripheral surface (edge surface) 4b of the cover 4 and in the vicinity of the outer peripheral surface (edge surface) 4b. That is, the butting surface 4c of the cover 4 and the butting surface 3c of the case 3 are butted against each other, and the snap-fit portion 41 is provided inside the butting surface 4c and is inserted into the case 3 from the inside of the butting surface 3c of the case 3.

Note that in FIG. 2, there is a gap between the cover 4 and the case 3, but this gap may be filled with a sealing material.

According to the present embodiment, the fitting hole 32 is provided at the position of the side wall of the case 3 facing the fitting recess 33. As a result, a mold for forming the fitting recess 33 can be inserted from the fitting hole 32, and the snap-fit portion 41 fitted with the fitting recess 33 is not exposed to the outer surface of the case while molding by the mold is enabled, so that a waterproof function is improved.

In the present embodiment, waterproof performance can be improved in the snap-fit portion 41 on the fitting recess 33 side among two snap-fit portions 41. Therefore, the vehicle control device 100 is preferably mounted such that the outer peripheral surface 3b of the case 3 provided with the fitting recess 33 faces upward, and the outer peripheral surface 3b of the case 3 provided with the fitting hole 32 faces downward. For this reason, the arrangement of the fitting recess 33 and the fitting hole 32 may be configured to be opposite to that in FIG. 1. Alternatively, the snap-fit portion 41 may be configured such that the fitting recess 33 and the fitting hole 32 are arranged on the side wall along the vertical direction H.

The waterproof performance may be improved by appropriately providing a sealing material on the fitting hole 32 side where a waterproof function cannot be obtained unlike the fitting recess 33 side. In this case, since the work of providing the sealing material may be performed in one snap-fit portion 41 of the two snap-fit portions 41, the work efficiency is improved.

In the present embodiment, due to the above-described configuration of the two snap-fit portions 41, the fitting recess 33, and the fitting hole 32, the snap-fit portion 41 does not protrude from the outer peripheral surface (the side surface on the outside: outer side surface) 3b of the case 3, and the outer peripheral surface 3b of the case 3 and the outer peripheral surface 4b of the cover 4 are flush with each other. As described above, the vehicle control device 100 of the present embodiment has the snap-fit portion capable of improving the waterproof performance with a simple shape and reducing a protruding amount of protruding to the inside from the inner peripheral surface 3d of the housing or to the outside from the outer peripheral surface 3b.

The present embodiment described above has the following features.

(1) A vehicle control device includes: a substrate 1 which includes an electronic circuit for controlling a vehicle; a case 3 which has an opening portion 31 at one end and is fixed in a state where the substrate 1 is inserted; and a cover 4 which is assembled to the case 3 so as to cover the opening portion 31, wherein a fitting recess 33 is provided in the case 3, and a first snap-fit portion 41 having a first fitting protrusion 42 fitted in the fitting recess 33 is provided in the cover 4, the fitting recess 33 does not penetrate a member of the case 3 and is provided in a state where a side opposite to a side to which the first fitting protrusion 42 is fitted is closed, and the first fitting protrusion 42 is inserted into the case 3 to be fitted into the fitting recess 33.

(2) A fitting hole 32 is provided in the case 3, and a second snap-fit portion 41 having a second fitting protrusion 42 fitted in the fitting hole 32 is provided in the cover 4, and the fitting hole 32 is provided so as to penetrate a member of the case 3.

(3) The fitting recess 33 is provided in a state where the side opposite to the side to which the first fitting protrusion 42 is fitted is closed by the outer peripheral surface of the case 3.

(4) The vehicle control device 100 is mounted such that the outer peripheral surface 3b portion of the case 3 provided with the fitting recess 33 faces upward, and the outer peripheral surface 3b of the case 3 provided with the fitting hole 32 faces downward.

Second Embodiment

Figure 3:
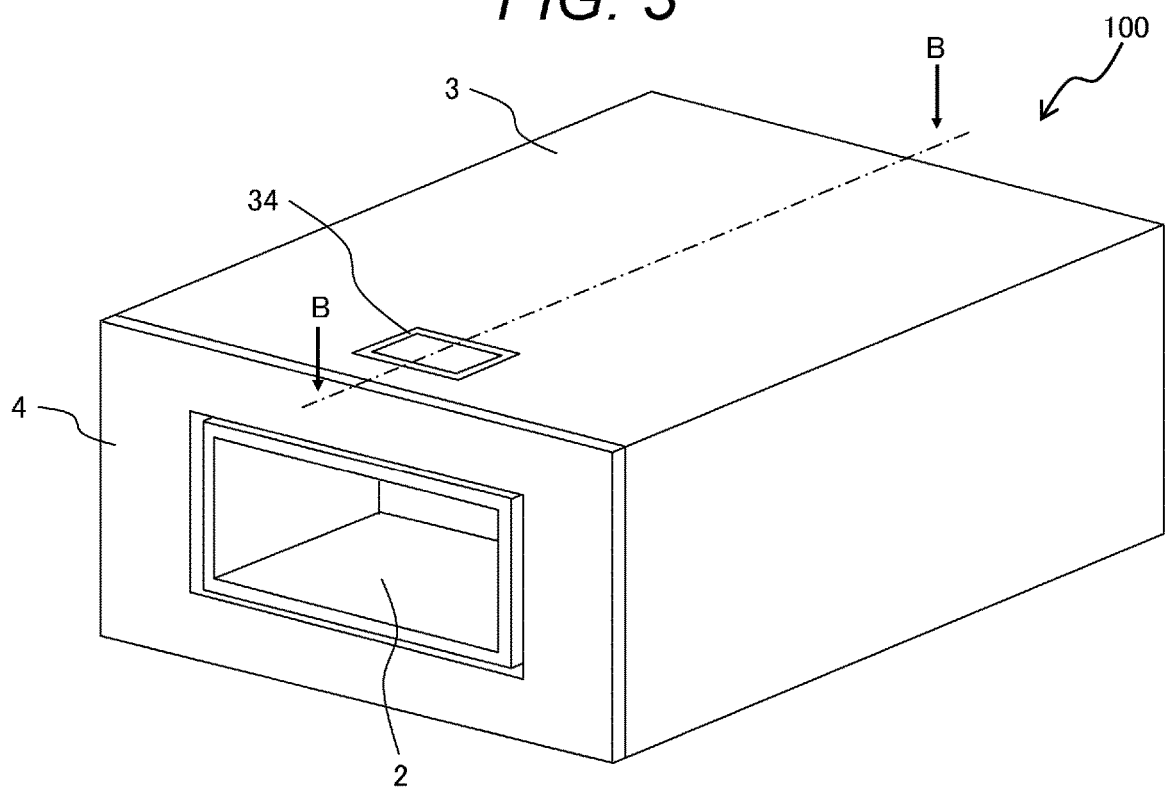
FIG. 3 is a perspective view illustrating an external appearance of a vehicle control device according to an embodiment (second embodiment) of the present invention.
Figure 4:
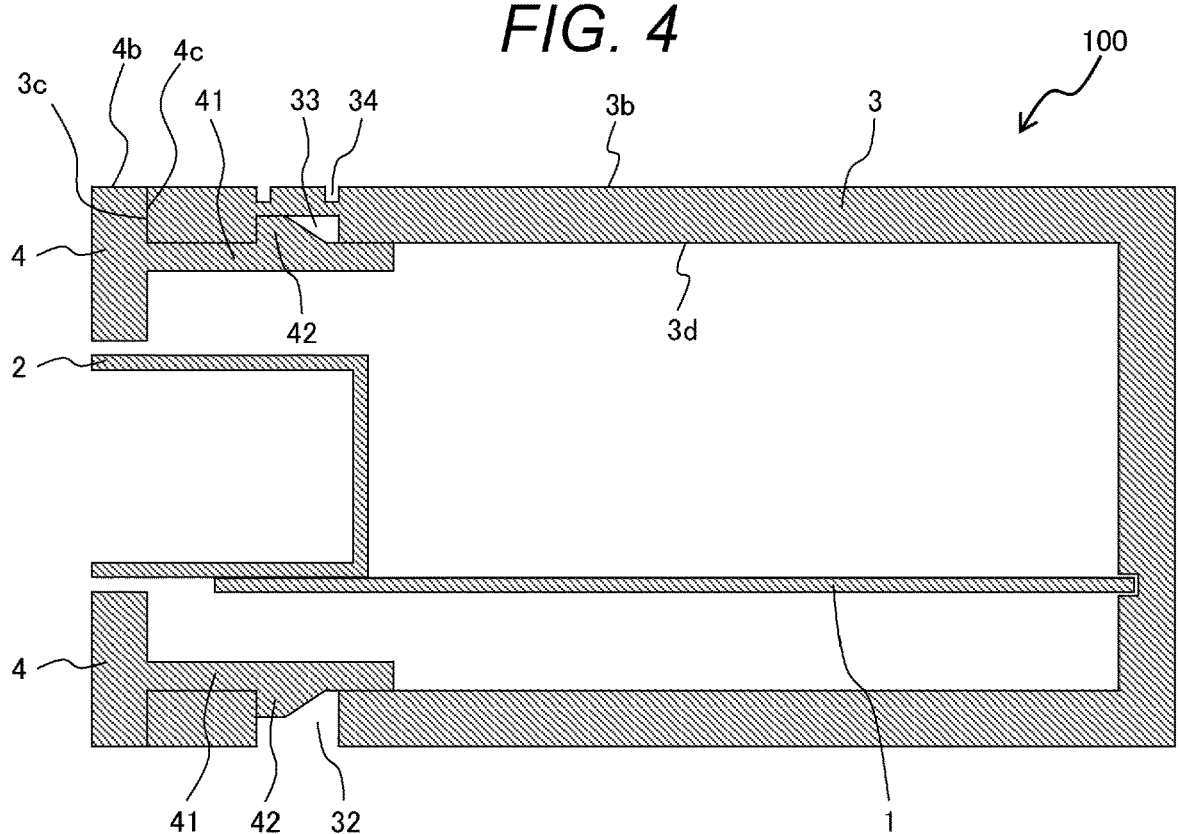
FIG. 4 is a cross-sectional view taken along line B-B in FIG. 3.

A second embodiment of the present invention will be described with reference to FIGS. 3 and 4. FIG. 3 is a perspective view illustrating an external appearance of a vehicle control device according to an embodiment (second embodiment) of the present invention. FIG. 4 is a cross-sectional view taken along line B-B in FIG. 3. Note that FIG. 4 is a cross-sectional view taken in a B-B direction in FIG. 1.

The vehicle control device 100 of the present embodiment is different from that of the first embodiment in that a groove 34 is provided on the outer peripheral surface 3b side of the fitting recess 33. That is, the case 3 has the groove 34 formed on the outer peripheral surface 3b side of the portion where the fitting recess 33 is formed.

Specifically, the groove 34 is provided on the outer peripheral surface 3b side of the portion of the case 3 where the fitting recess 33 is formed. The fitting recess 33 is formed as a recess recessed outward from the inner peripheral surface 3d of the case 3, and the groove 34 is formed as a recess recessed inward from the outer peripheral surface 3b of the case 3.

By providing the groove 34, it is possible to specify a place where the fitting protrusion 42 and the fitting recess 33 are fitted to each other. According to the present embodiment, in a case where it is necessary to investigate the substrate 1 after the cover 4 is assembled to the case 3, it is necessary to remove the fitting between the case 3 and the cover 4. By breaking the groove 34 with a flathead screwdriver or the like, the fitting protrusion 42 can be easily exposed.

Third Embodiment

Figure 5:
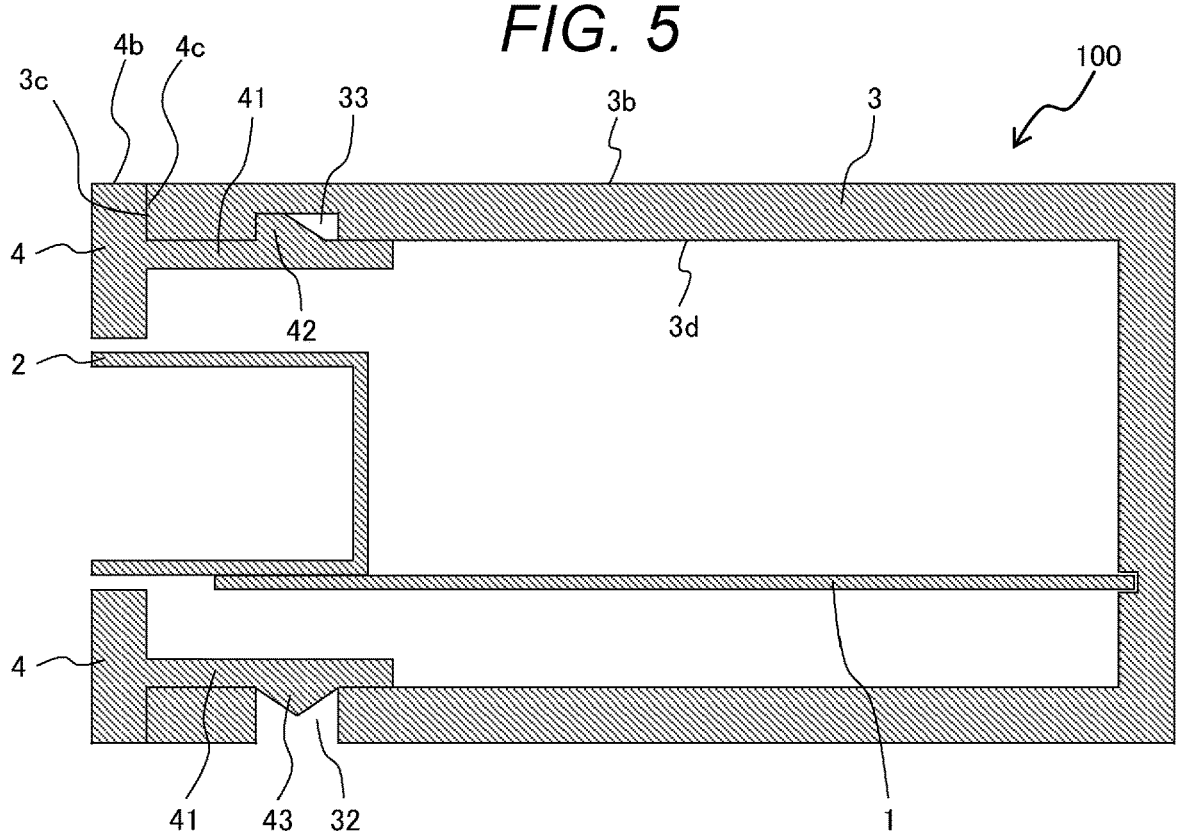
FIG. 5 is a view of a vehicle control device according to an embodiment (third embodiment) of the present invention, and is a cross-sectional view illustrating a cross section similar to that in FIG. 2.

A third embodiment of the present invention will be described with reference to FIG. 5. FIG. 5 is a view of a vehicle control device according to an embodiment (third embodiment) of the present invention, and is a cross-sectional view illustrating a cross section similar to that in FIG. 2.

The vehicle control device 100 of the present embodiment is different from that of the first embodiment in that the snap-fit portion 41 is provided with the fitting protrusion 43, and the fitting protrusion 43 is press-fitted into the fitting hole 32. That is, the second fitting protrusion 43 of the present embodiment is press-fitted into the fitting hole 32 provided on the side of the case 3.

With the above configuration, there is no gap between the fitting protrusion 43 and the fitting hole 32. According to the present embodiment, it is possible to suppress the entry of liquid from the fitting hole 32 penetrating the case 3. In addition, by making the maximum cross-sectional area of the cross section perpendicular to the fitting direction of the fitting protrusion 43 larger than the opening portion area of the fitting hole 32, the depth at which the fitting protrusion 43 is press-fitted into the fitting hole 32 in the fitting direction increases, the effect of eliminating the gap is enhanced by the press-fitting, and the effect of suppressing the entry of liquid is enhanced. In addition, the shape of the fitting protrusion 43 preferably has a cross-sectional shape that matches the cross-sectional shape of the fitting hole 32. In the present embodiment, the cross-sectional shape of the fitting hole 32 is a polygonal pyramid shape or a conical shape. Correspondingly, a cross-sectional shape of the second fitting protrusion 43 perpendicular to the fitting direction is a polygonal frustum shape or a conical shape.

Fourth Embodiment

Figure 6:
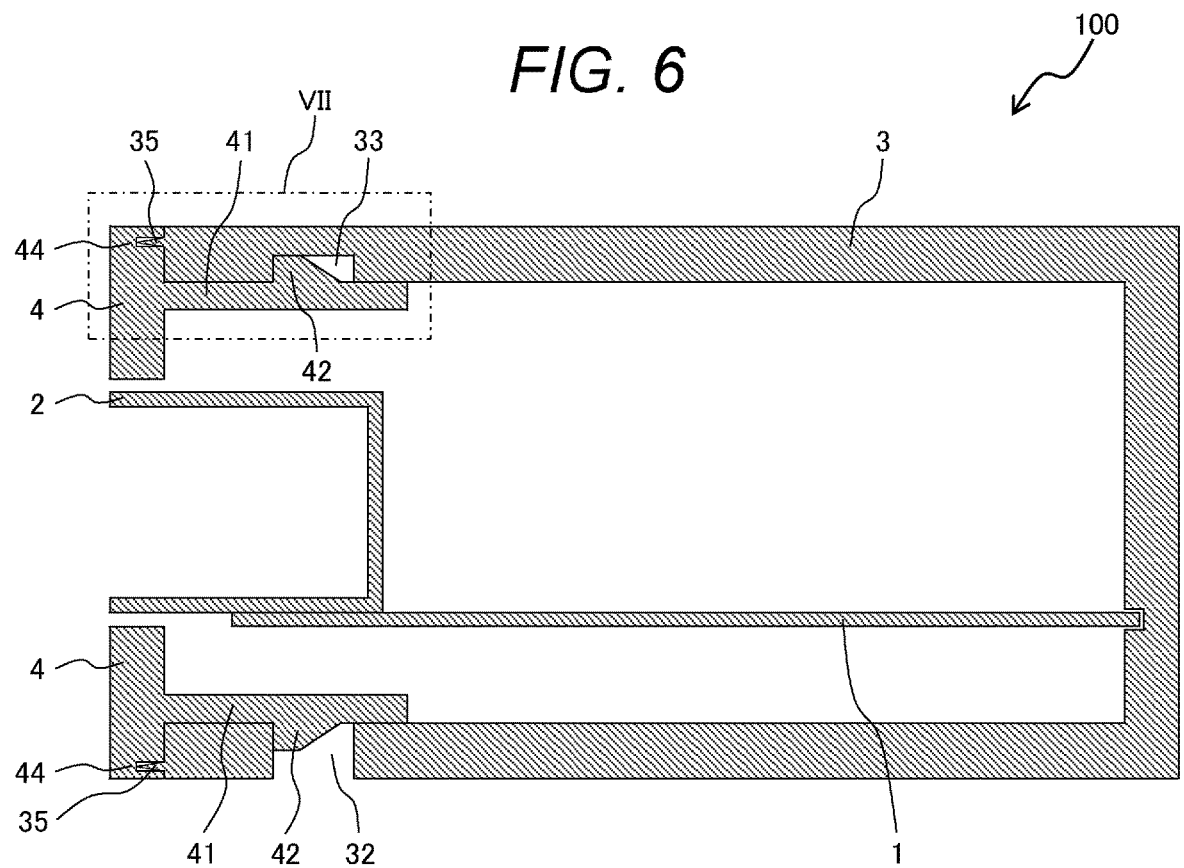
FIG. 6 is a view of a vehicle control device according to an embodiment (fourth embodiment) of the present invention, and is a cross-sectional view illustrating a cross section similar to that in FIG. 2.
Figure 7:
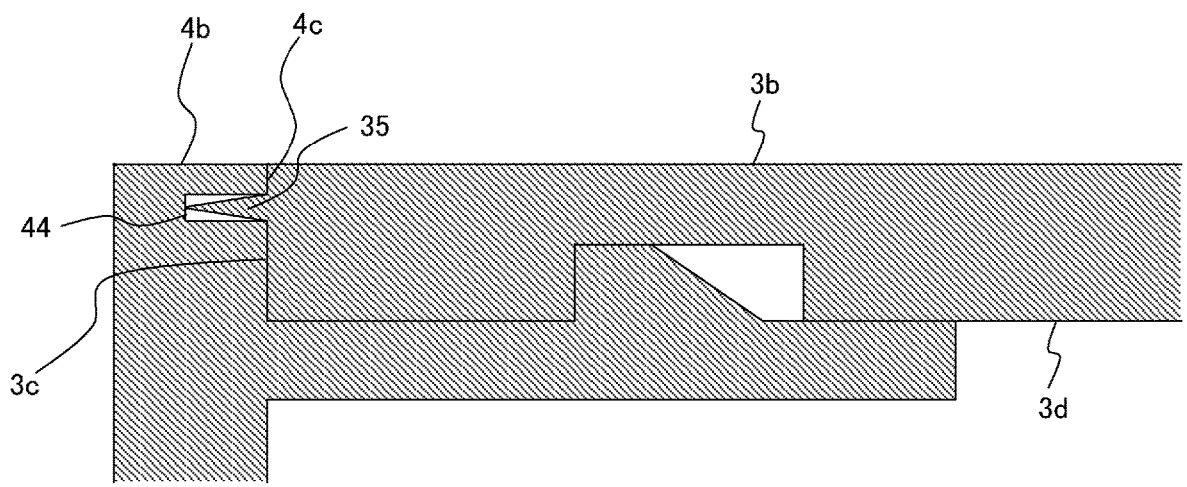
FIG. 7 is an enlarged cross-sectional view of a portion VII in FIG. 6.

A fourth embodiment of the present invention will be described with reference to FIGS. 6 and 7. FIG. 6 is a view of a vehicle control device according to an embodiment (fourth embodiment) of the present invention, and is a cross-sectional view illustrating a cross section similar to that in FIG. 2. FIG. 7 is an enlarged cross-sectional view of a portion VII in FIG. 6.

The vehicle control device 100 of the present embodiment is different from that of the first embodiment in that a seal structure is added to a joint surface between the case 3 and the cover 4. A projection 35 is provided at an opening edge portion (an end surface formed around the opening portion 31) of the case 3 which is fitted to the cover 4, and a recess 44 is provided at a position on the cover 4 side which is fitted to the projection 35. That is, the projection 35 is provided on the end surface (butting surface) 3c of the case 3, and the recess 44 is provided on the butting surface 4c of the cover 4. However, the projection 35 may be provided on the butting surface 4c of the cover 4, and the recess 44 may be provided on the end surface (butting surface) 3c of the case 3.

That is, in the vehicle control device 100 of the present embodiment, the recess 44 is provided in any one of the end surface (butting surface) 3c formed around the opening portion 31 of the case 3 and the facing surface (butting surface) 4c of the cover 4 facing the end surface 3c of the case 3, and the projection 35 is provided in the other. The projection 35 is formed continuously with the case 3 or the cover 4 on which the projection 35 is provided. The recess 44 and the projection 35 engage with each other to exert a fixing force for fixing the cover 4 and the case 3. Note that the fixing force exerted by the recess 44 and the projection 35 is not necessarily 100% of the fixing force for fixing the cover 4 and the case 3.

According to the present embodiment, the effect of preventing liquid from entering from the fitting surface between the case 3 and the cover 4 is improved. In addition, the projection 35 may have a triangular shape with a pointed tip on the cross section of FIG. 7. That is, it is preferable that the projection 35 extends along the periphery of the opening portion 31 of the case 3 and has a triangular cross-sectional shape perpendicular to the extending direction.

Fifth Embodiment

Figure 8:
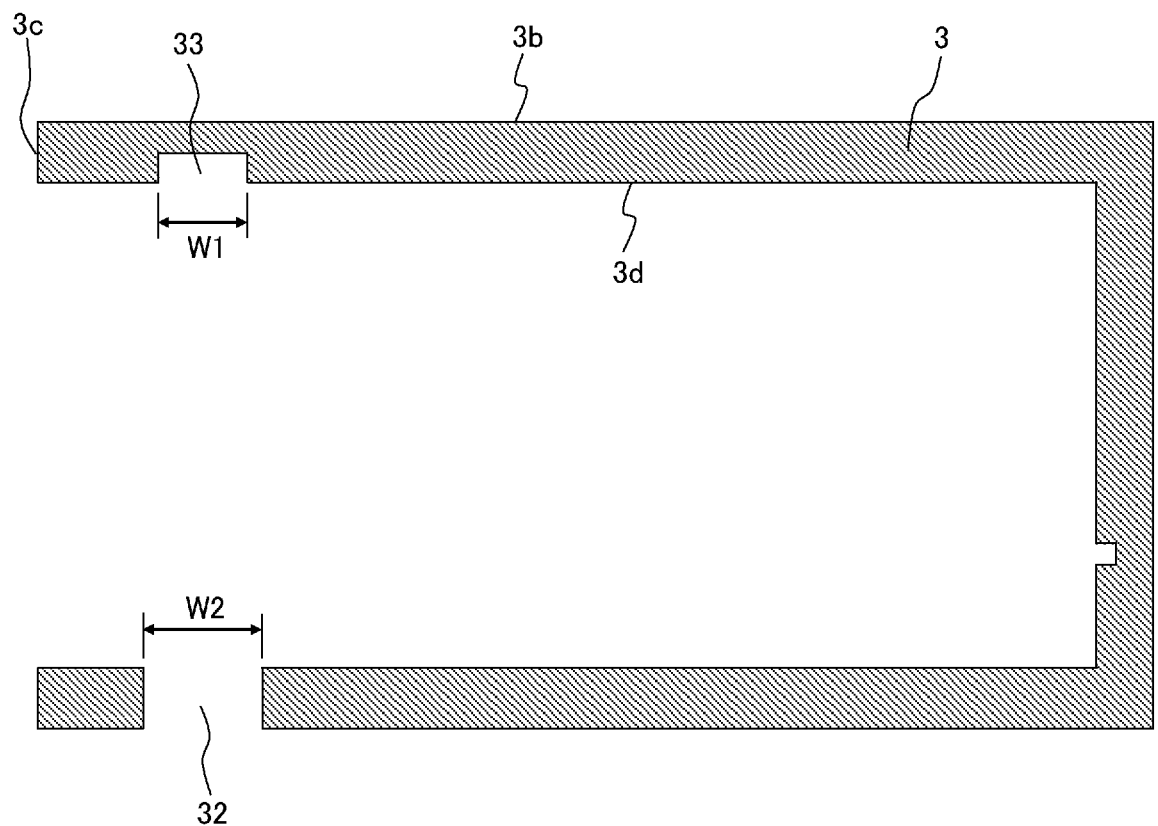
FIG. 8 is a view of a case 3 according to an embodiment (fifth embodiment) of the present invention, and is a cross-sectional view illustrating a cross section of the case 3 similar to that in FIG. 2.

A fifth embodiment of the present invention will be described with reference to FIG. 8. FIG. 8 is a view of the case 3 according to an embodiment (fifth embodiment) of the present invention, and is a cross-sectional view illustrating a cross section of the case 3 similar to that in FIG. 2.

The vehicle control device 100 of the present embodiment is different from that of the first embodiment in that an opening portion area W2 of the fitting hole 32 of the case 3 is larger than a cross-sectional area W1 perpendicular to the depth direction of the fitting recess 33.

In the present embodiment, the mold for forming the fitting recess 33 can be thickened, a mold life can be lengthened, and the risk of breakage of the mold can be reduced.

When the fitting recess 33 is formed by the mold inserted from the fitting hole 32, the opening portion area W2 needs to be equal to or larger than the cross-sectional area W1.

Sixth Embodiment

Figure 9:
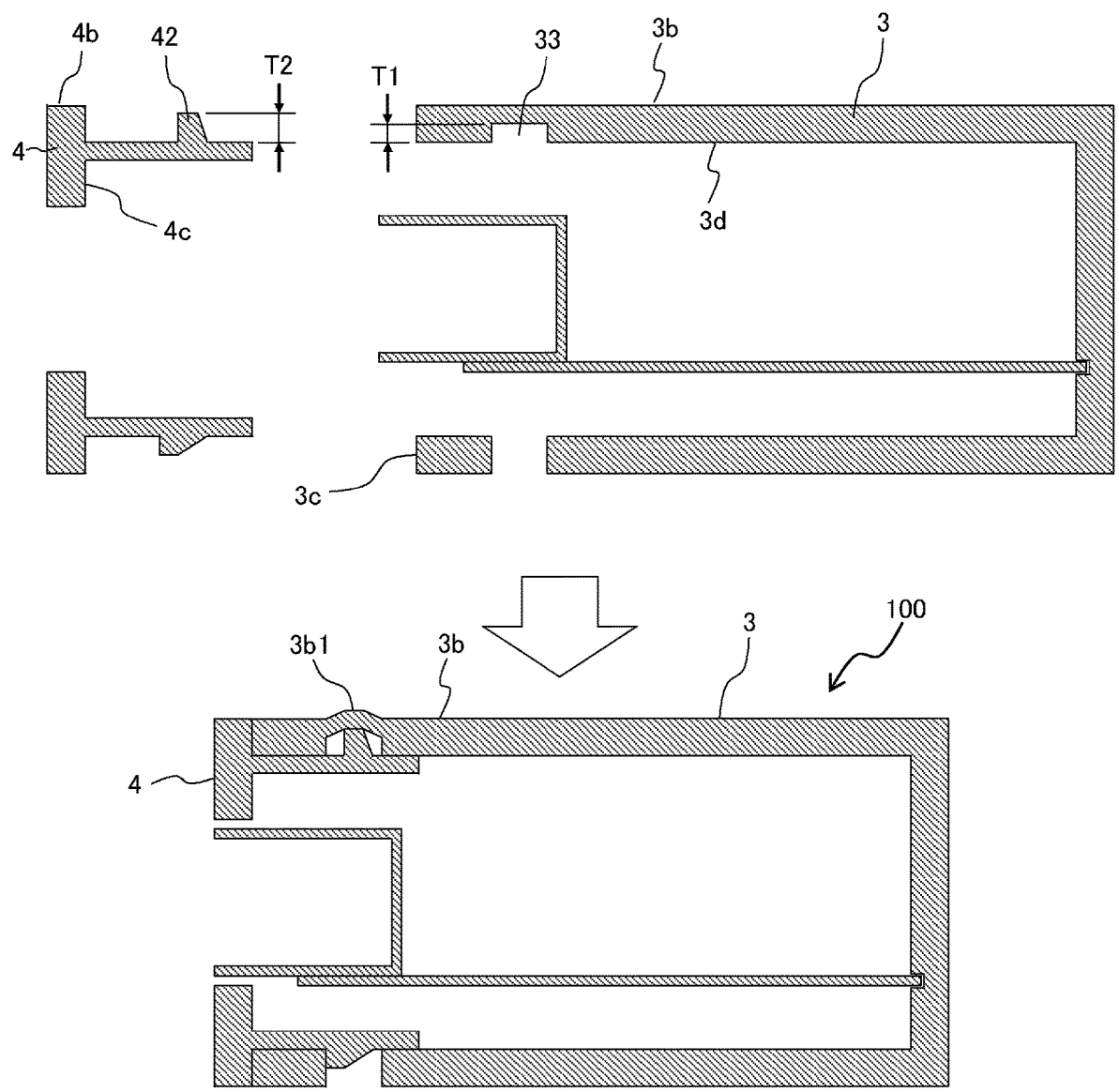
FIG. 9 is an exploded cross-sectional view and an assembly cross-sectional view of a vehicle control device according to an embodiment (sixth embodiment) of the present invention.

A sixth embodiment of the present invention will be described with reference to FIG. 9. FIG. 9 is an exploded cross-sectional view and an assembly cross-sectional view of a vehicle control device according to an embodiment (sixth embodiment) of the present invention.

The vehicle control device 100 of the present embodiment is different from that of the first embodiment in that a height T2 of the fitting protrusion (first fitting protrusion) 42 fitted into the fitting recess 33 is larger than a depth T1 of the fitting recess 33.

In the present embodiment, the fitting protrusion 42 pushes up the bottom surface of the fitting recess 33 to form a bulging (bulging portion) 3b1 on the outer peripheral surface 3b of the case 3. Therefore, it can be confirmed from the appearance that the fitting protrusion 42 and the fitting recess 33 are fitted to each other.

Note that the present invention is not limited to the above-described embodiments, and various modifications are included. For example, the above-described embodiments have been described in detail for easy understanding of the invention and are not necessarily limited to those having all the configurations. In addition, a part of the configuration of a certain embodiment can be replaced with the configuration of another embodiment, and the configuration of another embodiment can be added to the configuration of a certain embodiment. It is possible to add, delete, and replace other configurations for a part of the configuration of each embodiment.

REFERENCE SIGNS LIST 1 substrate
2 connector
3 case
3b outer peripheral surface of case 3
3c end surface (butting surface) of case 3
3d inner peripheral surface of case 3
31 opening portion of case 3
32 fitting hole
33 fitting recess
34 groove
35 projection
4 cover
4c butting surface of cover 4
41 snap-fit portion
42 fitting protrusion
43 fitting cone
44 recess
100 vehicle control device

The invention claimed is:

1. A vehicle control device comprising:
a substrate which includes an electronic circuit for controlling a vehicle;
a case which has an opening portion at one end and fixed in a state where the substrate is inserted; and
a cover which is assembled to the case so as to cover the opening portion,
wherein
a fitting recess is provided in the case, and a first snap-fit portion having a first fitting protrusion fitted in the fitting recess is provided in the cover,
the fitting recess does not penetrate a member of the case and is provided in a state where a side opposite to a side to which the first fitting protrusion is fitted is closed, and
the first fitting protrusion is inserted into the case to be fitted into the fitting recess, wherein
a fitting hole is provided in the case, and a second snap-fit portion having a second fitting protrusion fitted in the fitting hole is provided in the cover, and
the fitting hole is provided so as to penetrate a member of the case.

2. The vehicle control device according to claim 1, wherein the fitting recess is provided in a state where the side opposite to the side to which the first fitting protrusion is fitted is closed by an outer peripheral surface of the case.

3. The vehicle control device according to claim 1, wherein the vehicle control device is mounted such that an outer peripheral surface portion of the case provided with the fitting recess faces upward, and an outer peripheral surface portion of the case provided with the fitting hole faces downward.

4. The vehicle control device according to claim 2, wherein the case has a groove formed on an outer peripheral surface side of a portion where the fitting recess is formed.

5. The vehicle control device according to claim 1, wherein the second fitting protrusion is press-fitted into the fitting hole provided on a side of the case.

6. The vehicle control device according to claim 5, wherein a maximum cross-sectional area of a cross section perpendicular to the fitting direction of the second fitting protrusion is larger than an opening portion area of the fitting hole.

7. The vehicle control device according to claim 6, wherein the second fitting protrusion has a polygonal pyramid shape or a conical shape in the cross section perpendicular to the fitting direction.

8. The vehicle control device according to claim 1, wherein an opening portion area of the fitting hole is larger than a cross-sectional area perpendicular to a depth direction of the fitting recess.

9. The vehicle control device according to claim 1, wherein a height of the first fitting protrusion is larger than a depth of the fitting recess.

10. A vehicle control device comprising:
- a substrate which includes an electronic circuit for controlling a vehicle;
- a case which has an opening portion at one end and fixed in a state where the substrate is inserted; and
- a cover which is assembled to the case so as to cover the opening portion, wherein
- a fitting recess is provided in the case, and a first snap-fit portion having a first fitting protrusion fitted in the fitting recess is provided in the cover,
- the fitting recess does not penetrate a member of the case and is provided in a state where a side opposite to a side to which the first fitting protrusion is fitted is closed, and
- the first fitting protrusion is inserted into the case to be fitted into the fitting recess, wherein
- a recess is provided in one of an end surface formed around the opening portion of the case and a facing surface of the cover facing the end surface of the case, and a projection is provided in the other of the end surface and the facing surface,
- the projection is formed continuously with the case or the cover on which the projection is provided, and
- the recess and the projection engage with each other to exert a fixing force for fixing the cover and the case.

11. The vehicle control device according to claim 10, wherein the projection extends along a periphery of the opening portion of the case, and has a triangular cross-sectional shape perpendicular to an extending direction of the projection.

* * * * *